United States Patent
Kawata et al.

(10) Patent No.: US 6,467,490 B1
(45) Date of Patent: Oct. 22, 2002

(54) PROCESS FOR USING A HIGH NITROGEN CONCENTRATION PLASMA FOR FLUORINE REMOVAL FROM A REACTOR

(75) Inventors: Hidenori Kawata; Asad Haider, both of Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/382,917

(22) Filed: Aug. 25, 1999

Related U.S. Application Data

(60) Provisional application No. 60/098,411, filed on Aug. 31, 1998.

(51) Int. Cl.$^7$ .................................................. B08B 6/00
(52) U.S. Cl. ........................................ 134/1.1; 216/67
(58) Field of Search ........................ 134/1.1; 156/643; 438/905; 216/67

(56) References Cited

U.S. PATENT DOCUMENTS

| | | | | |
|---|---|---|---|---|
| 4,820,377 A | * | 4/1989 | Davis et al. ................. | 156/643 |
| 5,085,727 A | * | 2/1992 | Steger ........................ | 156/345 |
| 5,129,958 A | * | 7/1992 | Nagashima et al. ....... | 134/22.1 |
| 5,207,836 A | * | 5/1993 | Chang ........................... | 134/1 |
| 5,647,953 A | * | 7/1997 | Williams et al. .......... | 156/643.1 |
| 5,730,834 A | * | 3/1998 | Gabriel ....................... | 156/643 |
| 5,753,137 A | * | 5/1998 | Ye et al. ..................... | 252/79.1 |
| 5,824,375 A | * | 10/1998 | Gupta .......................... | 427/569 |
| 5,935,340 A | * | 8/1999 | Xia et al. .................... | 134/1.1 |

FOREIGN PATENT DOCUMENTS

JP      08127885    *   5/1996

* cited by examiner

*Primary Examiner*—Randy Gulakowski
(74) *Attorney, Agent, or Firm*—Carlton H. Hoel; W. James Brady; Frederick J. Telecky, Jr.

(57) ABSTRACT

A process of removing fluorine from a chemical deposition reactor includes the step of injecting a gaseous mixture of nitrogen and hydrogen into the reactor, the volume ratio of nitrogen to hydrogen in the gaseous mixture being in the range of from 1:1 to 6:1. More preferably the $N_2/H_2$ ratio is in the range of 2.5 to 4.5:1. The gaseous mixture is ionized with a RF induced energy discharge, with a RF power setting typically in the range of from 200 to 250 watts at an RF frequency of 13.5 MHZ. The gaseous mixture is injected into the reactor for a predetermined period of time based upon the thickness of a material, typically a metal such as tungsten, deposited upon a wafer in the reactor during a semiconductor fabrication process.

22 Claims, 2 Drawing Sheets

PROCESS FOR USING A HIGH NITROGEN CONCENTRATION PLASMA FOR FLUORINE REMOVAL FROM A REACTOR

TECHNICAL FIELD OF THE INVENTION

The present invention relates in general to the field of fabrication of semiconductor devices and, more particularly, to the use of a high nitrogen concentration plasma to remove fluorine from a reactor in which fluorine compounds are utilized in manufacturing.

BACKGROUND OF THE INVENTION

Without limiting the scope of the invention, its background is described in connection with chemical vapor deposition processes and equipment.

As is well known in the art of semiconductor fabrication, the manufacturing cost of a given integrated circuit is largely dependent upon processing costs, yield factors, and equipment downtime. In the case of chemical vapor deposition processes utilizing fluorine compounds, such as the deposition of tungsten with $WF_6$, fluorine radicals and fluorine compounds such as hydrogen fluoride are released. Since most conventional CVD reactors have internal surfaces fabricated from aluminum, fluorine radicals released during the deposition process tend to react with the aluminum components to form aluminum fluoride particles, especially in the presence of water vapor. The presence of these particles in the reactor can result in serious yield losses. Additionally, the reaction between fluorine radicals and chamber components tends to shorten the useful life of the reactor components and increases equipment downtime.

Efforts to find more inert surfaces capable of withstanding fluorine attack have included the use of anodized aluminum and certain nickel plated components. These efforts have not, however, proven totally satisfactory in alleviating the problems resulting from the formation of aluminum fluoride particles.

While the work in finding materials more resistant to fluorine ion attack continues, there is a strong need for a process that minimizes or eliminates fluorine ions in the reactor. Thus, there exists a need for an improved process for removing fluorine from CVD reactors that addresses the aforementioned problems and drawbacks.

SUMMARY OF THE INVENTION

The present invention provides a method for using current semiconductor manufacturing equipment that more adequately meets the demands of VLSI and ULSI integrated circuits. In particular the invention provides a means of removing fluorine from a CVD reactor in order to reduce aluminum fluoride particle contamination and reactor component wear.

In one embodiment, the invention provides a method of in-situ cleaning of a reactor to remove fluorine. Subsequent to a deposition step in the fabrication of a semiconductor device, for example, the deposition of tungsten with $WF_6$, the reactor is cleaned by injecting a gaseous plasma mixture of nitrogen and hydrogen into the reactor, the volume ratio of nitrogen to hydrogen being in the range of from 2.5:1 to 4.5:1. In one application the volume ratio of nitrogen to hydrogen injected into the reactor is 3.5:1.

The duration of the cleaning may be determined as a function of the thickness of a material deposited upon a wafer during a semiconductor fabrication process. The deposited material may be a metal, such as tungsten, or a dielectric, such as silicon oxide or silicon nitride. In a typical application, the period of time that the gaseous mixture is injected into the reactor is about 1.5 to about 2.3 seconds per 100 angstroms of tungsten deposition. In one embodiment, the gaseous mixture is injected into the reactor for 1.5 seconds per 100 angstroms of tungsten deposition. The flow of the mixture of nitrogen and hydrogen to the reactor may also be approximately 25 reactor volumes during the cleaning process.

Typically the cleaning process is conducted under pressures between 700 and 90 mtorr. The gaseous mixture is injected into the reactor for a period of between 1.5 and 2.3 seconds per 100 angstroms of tungsten deposition. An RF discharge of approximately 13.5 MHZ and power settings of from 200 to 250 watts is used to ionize the gaseous mixture. In one application, the cleaning process is conducted under a pressure of 800 mtorr with an RF frequency of 13.5 MHZ, a power setting of 225 watts, and a temperature of approximately 475° C.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and are not to delimit the scope of the invention.

The release of fluorine radicals during chemical vapor deposition processes utilizing fluorine compounds during the fabrication of semiconductor devices, for example, to deposit tungsten films with $WF_6$, results in the formation of fluorine radicals. These radicals attack internal reactor components fabricated from aluminum resulting in the formation of aluminum fluoride. One approach to alleviating the problem has been to purge the reactor with a hydrogen plasma containing a small amount of nitrogen. This approach is illustrated and discussed in connection with the first of the following examples:

EXAMPLE 1

A CVD reactor having a volume of 6300 $cm^3$ is cleaned with $NF_3$ subsequent to a tungsten deposition process utilizing $WF_6$ as a tungsten source. The reactor is then purged in a two step process in accordance with the prior practice with the following parameters:

Step 1
   $N_2$=100 sccm
   $H_2$=300 sccm
   Pressure=800 mtorr
   RF Power=225 watts
   Time=5 seconds
Step 2
   $N_2$=30 sccm
   $H_2$=500 sccm
   Pressure=800 mtorr
   RF Power=225 watts
   Time=180 seconds*

*Normally 10 seconds.

Figure 1:
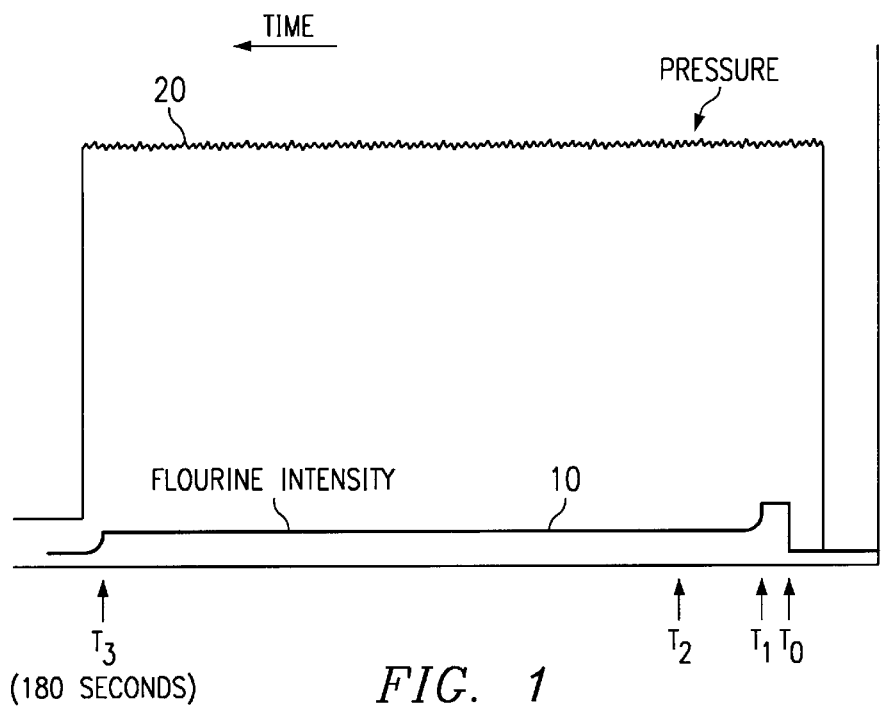
FIG. 1 is a graphical temporal representation of a conventional reactor purge procedure for removing fluorine from a reactor.

Referring now to FIG. 1, a graphical representation of this procedure is illustrated. At $T_0$ a gaseous mixture of 100 standard cubic centimeters per minute ("sccm") of nitrogen and 300 sccm of hydrogen ($N_2/H_2$=1:3) is injected into the reactor at a pressure of 800 mtorr for a period of five (5) seconds. The mixture is subjected to a 225 watt RF discharge at 13.5 MHz as it enters the reactor to ionize the gas molecules. At $T_1$, the second step of the procedure is initiated and the mixture is changed to 500 sccm of hydrogen and 30 sccm of nitrogen ($N_2/H_2$=3:50). The second mixture is also exposed to a 225 watt RF discharge at 13.5 MHZ as it enters the reactor. Typically, after approximately 10 seconds ($T_2$), the purge is considered complete and the gas flow is terminated. However, for the purpose of illustration, in this example the second step is conducted for a period of 180 seconds.

As illustrated, FIG. 1 shows a temporal profile 10 of fluorine in the reactor as measured using an optical emission spectrometer tuned to 704 nm wavelength during the cleaning process. Also illustrated is the reactor pressure 20 during the cleaning process. As shown, the fluorine concentration increases briefly during step 1 of the cleaning process as fluorine desorbs from the reactor surfaces and then declines to a steady state level between $T_1$ and $T_2$, the normal 10 second increment during which the second cleaning step is conducted. Further, no appreciable decrease in fluorine concentration is observed as the duration of the second step is increased up to 180 seconds ($T_3$).

EXAMPLE 2

A CVD reactor having a volume of 6300 cm³ is cleaned with NF3 subsequent to a tungsten deposition process utilizing $WF_6$ as a tungsten source. The reactor is cleaned in accordance with a single step cleaning process of one embodiment of the present invention. The cleaning process parameters are set forth below:

Single Step Parameters
   $N_2$=200 sccm
   $H_2$=55 sccm
   Pressure=800 mtorr
   RF Power=225 watts
   Time=180*

*Dependent upon deposition layer thickness.

Figure 2:
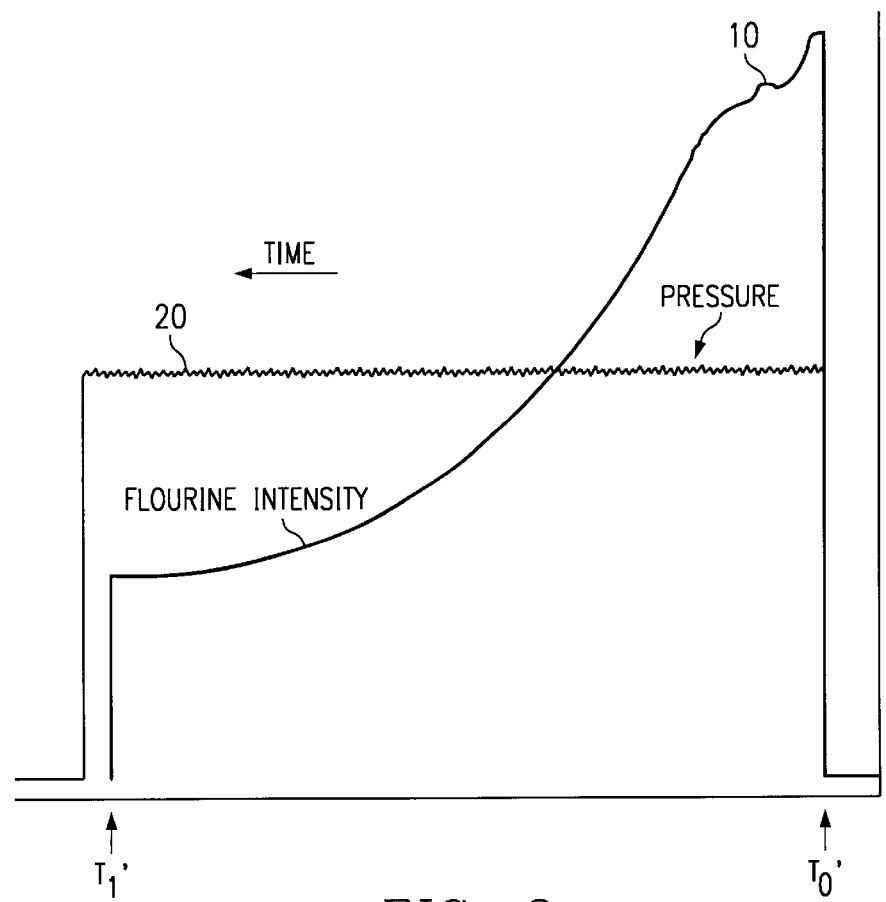
FIG. 2 is a graphical temporal representation of a reactor cleaning process in accordance with the present invention.

Referring now to FIG. 2, a graphical representation of the process of the invention, as illustrated by Example 2, is shown. At $T_0'$ a gaseous mixture of 200 standard cubic centimeters per minute ("sccm") of nitrogen and 55 sccm of hydrogen is injected into the reactor at a pressure of 800 mtorr for a period of one hundred and eighty (180) seconds. The mixture is subjected to a 225 watt RF discharge at 13.5 MHZ as it enters the reactor to ionize the gas molecules. The fluorine intensity is measured in the same manner as in connection with Example 1, and illustrated on the same scale as shown in FIG. 1. Surprisingly, as illustrated in FIG. 2, the fluorine intensity in the reactor initially increases dramatically at the outset of cleaning process ($T_0'$) as compared to Example 1 and then declines rapidly as the cleaning process continues. The large, sharp increase in fluorine intensity observed at ($T_0'$), along with the subsequent and significant decline in fluorine intensity, indicates that a significant amount of fluorine has been removed from the reactor during the cleaning process. Comparison of FIGS. 1 and 2 tends to indicate that the process of the invention provides for a significantly greater degree of desorption of fluorine from the reactor chamber internal components and subsequent removal from the reactor.

The superiority of the process of the present invention is evidenced through a number of advantages realized through the use of the invention. Use of the process reduces the amount of 0.5 micron particles observed in the reactor by a factor of 70%. Surprisingly, the rate of tungsten deposition is increased by a factor of approximately 20% after the reactor has been cleaned utilizing the process. For example, tungsten deposition rates of approximately 113 Å/sec. are observed after utilizing the cleaning process of the invention whereas the rate of deposition after purging in accordance with the above-described conventional method was approximately 93 Å/sec. The magnitude of this result is totally unanticipated and the physical and chemical mechanism of the reaction is not totally understood. However, the equilibrium relationship during the deposition process may provide a partial explanation of the observed results.

One possible explanation for the increase in the rate of tungsten deposition after cleaning a CVD reactor utilizing one embodiment of the invention is a decrease in the amount of reactable fluorine present in the reactor during the deposition process. The rate of tungsten deposition is, in part, governed by conditions in the reactor, including the following simplied relationship:

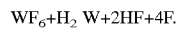

$$WF_6+H_2 \rightarrow W+2HF+4F.$$

Reducing the amount of fluorine in the reactor will tend to shift the above equilibrium relationship to the right. Thus, the process of the invention, by reducing the amount of fluorine present in the reactor after the cleaning process, results in a significantly increased rate of tungsten deposition. However, the magnitude of the change in deposition rate was not anticipated and the results indicate that additional reactions, not fully understood, are ongoing.

Figure 3:
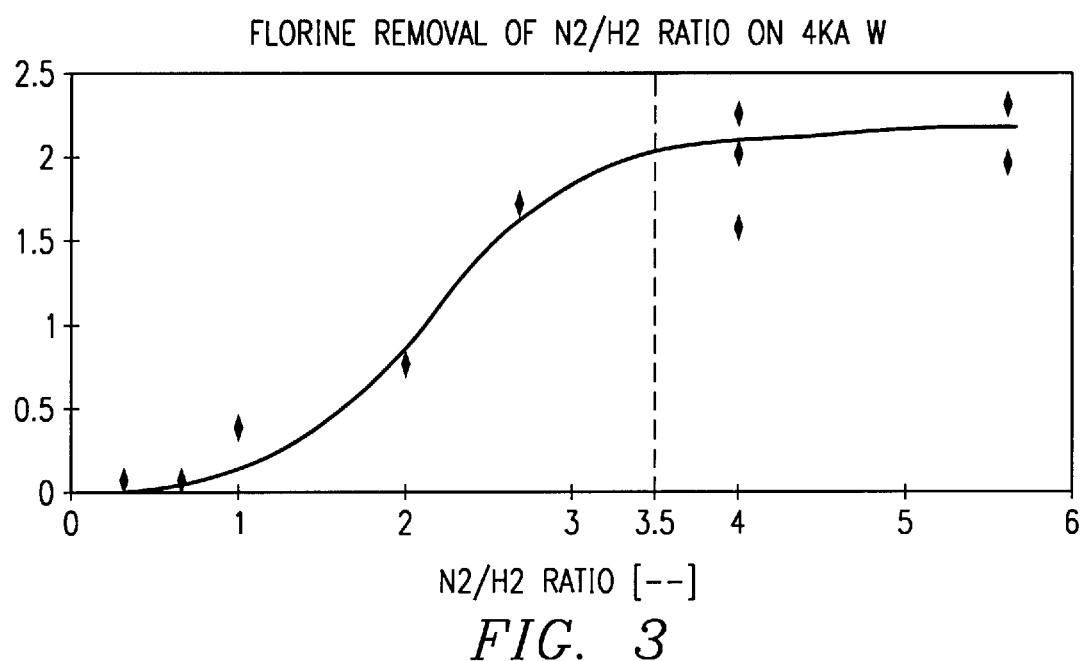
FIGS. 3 and 4 are graphical illustrations showing the impact of the $N_2/H_2$ gas ratio on fluorine removal from a reactor utilizing the process of the present invention.
Figure 4:
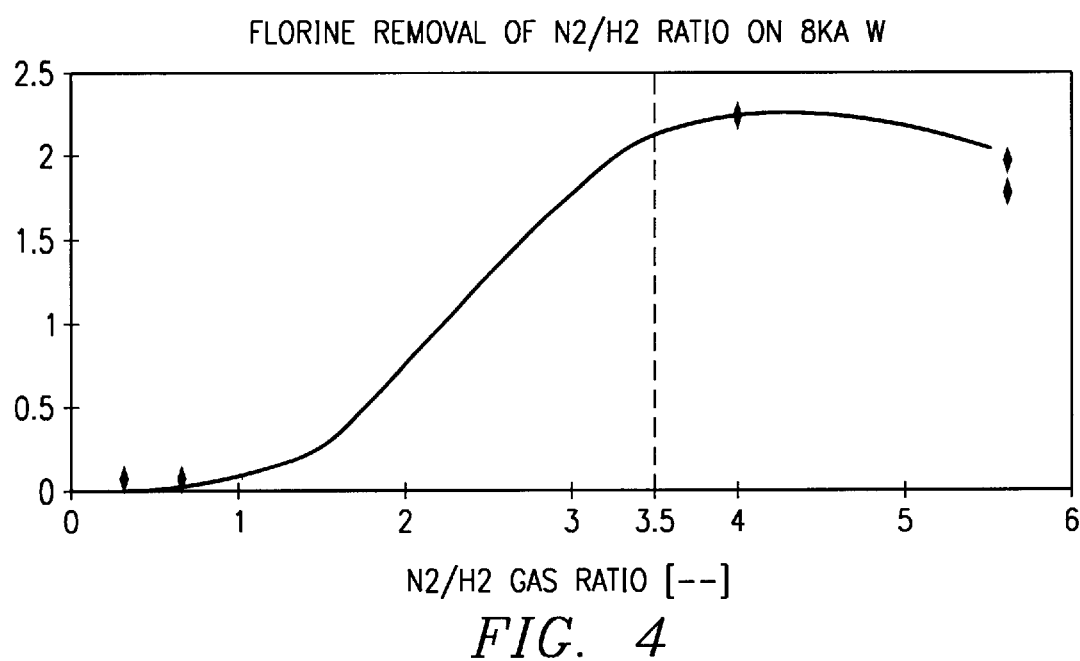

Turning now to FIGS. 3 and 4, fluorine removal at various $N_2/H_2$ injection ratios are graphically illustrated. The vertical scales on the drawings quantify the relative drop in fluorine ion intensity in the reactor after cleaning with different $N_2/H_2$ plasmas. The horizontal scale represents the $N_2/H_2$ ratio. More specifically, FIG. 3 shows the amount of fluorine removal from a reactor for various $N_2/H_2$ ratios after deposition of a 4000 Å tungsten layer. Similarly, FIG. 4 illustrates fluorine removal for various $N_2/H_2$ ratios after deposition of a 8000 Å tungsten layer. In each case, fluorine removal was determined at a typical RF power setting of 225 watts and a chamber pressure of 800 torr. As shown, the amount of fluorine removed from the reactor increases as the relative concentration of nitrogen increases up to an $N_2/H_2$ ratio of approximately 3.5:1. As illustrated, at $N_2/H_2$ ratios above 3.5:1, the rate of fluorine removal as a function of increasing concentrations of nitrogen relative to hydrogen levels out. Thus, the optimal ratio $N_2/H_2$ for the above-described conditions is approximately 3.5:1. However, as illustrated, good results may be obtained where the $N_2/H_2$ ratio is in the range of from 1:1 to 6:1. Preferably, the $N_2/H_2$ ratio is in the range of 2.5:1 to 4.5:1. Most preferably, under the described parameters the $N_2/H_2$ ratio is approximately 3.5:1.

The present invention also provides other advantages. For example, the lifetime of consumable parts subject to etching by fluorine radicals or fluorine containing compounds such HF is increased due to the decrease in fluorine in the reactor. Additionally, temperature variations in the reactor during tungsten deposition are observed to be decreased. After cleaning with the process of the invention, temperature variation within the reactor during tungsten deposition averages only 1.0° C., whereas temperature variations after purging the reactor in accordance with conventional procedures averaged 3.0° C.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of in-situ cleaning of a semiconductor fabrication reactor to remove fluorine comprising the step of:
    cleaning the reactor with a gaseous plasma mixture of nitrogen and hydrogen, the volume ratio of nitrogen to hydrogen being in the range of from 1:1 to 6:1.

2. The process of claim 1 wherein the period in which the gaseous mixture is injected into the reactor is a function of the thickness of a material deposited upon a wafer during a semiconductor fabrication process.

3. The process of claim 2 wherein the deposited material is a metal.

4. The process of claim 3 wherein the deposited metal is tungsten.

5. The process of claim 4 wherein the period of time that the gaseous mixture is injected into the reactor is between 1.5 and 2.3 seconds per 100 angstroms of tungsten deposition.

6. The process of claim one wherein the volume ratio of nitrogen to hydrogen is 3.5:1.

7. The process of claim 1 wherein the total flow of the mixture of nitrogen and hydrogen to the reactor is approximately 25 reactor volumes during the cleaning process.

8. The process of claim 1 wherein the cleaning process is conducted under a pressure of 900 mtorr.

9. The process of claim 1 wherein a RF discharge is used to ionize the mixture of nitrogen and hydrogen.

10. The process of claim 9 wherein the RF frequency is 13.5 MHZ.

11. The process of claim 9 wherein the RF power setting is 225 watts at an RF frequency of 13.5 MHZ.

12. The process of claim 9 wherein the RF power setting is from 200 to 250 watts at an RF frequency of 13.5 MHZ.

13. A method of removing fluorine from a chemical vapor deposition reactor comprising the steps of:
    injecting a gaseous mixture of nitrogen and hydrogen into the reactor, the volume ratio of nitrogen to hydrogen in the gaseous mixture being in the range of from 2.5:1 to 4.5:1; and
    ionizing the gaseous mixture with an RF induced energy discharge.

14. The process of claim 13 wherein the gaseous mixture is injected into the reactor for a predetermined period of time based upon the thickness of a material deposited upon a wafer in the reactor during a semiconductor fabrication process.

15. The process of claim 14 wherein the deposited material is a metal.

16. The process of claim 15 wherein the deposited metal is tungsten.

17. The process of claim 16 wherein the period in which the gaseous mixture is injected into the reactor for a period of about 1.5 seconds per 100 angstroms of tungsten deposition.

18. The process of claim 13 wherein the volume ratio of nitrogen to hydrogen is 3.5:1.

19. The process of claim 13 wherein the gaseous mixture is injected under a pressure of from 700 mtorr to 900 mtorr.

20. The process of claim 13 wherein the gaseous mixture is injected at a pressure of 800 mtorr.

21. The process of claim 13 wherein the RF power setting is from 200 to 250 watts.

22. The process of claim 13 wherein the RF power setting is 225 watts.

* * * * *